United States Patent
Myer et al.

(10) Patent No.: US 6,922,102 B2
(45) Date of Patent: Jul. 26, 2005

(54) HIGH EFFICIENCY AMPLIFIER

(75) Inventors: Robert E. Myer, Denville, NJ (US); Koon Whye Loh, Mendham, NJ (US); Loren Francis Root, McHenry, IL (US); Edward Vincent Louis, Saint Charles, IL (US)

(73) Assignee: Andrew Corporation, Orland Park, IL (US)

( * ) Notice: Subject to any disclaimer, the term of this patent is extended or adjusted under 35 U.S.C. 154(b) by 0 days.

(21) Appl. No.: 10/402,800

(22) Filed: Mar. 28, 2003

(65) Prior Publication Data

US 2004/0189380 A1 Sep. 30, 2004

(51) Int. Cl.$^7$ ............................. H03F 1/14; H03F 3/68
(52) U.S. Cl. ...................... 330/51; 330/53; 330/124 R; 330/285; 330/295; 333/109
(58) Field of Search .......................... 330/124 R, 285, 330/295, 51, 53; 604/114; 333/109

(56) References Cited

U.S. PATENT DOCUMENTS

| | | | |
|---|---|---|---|
| 4,439,744 A | * 3/1984 | Kumar et al. | ................ 330/285 |
| 4,631,492 A | 12/1986 | Magarshack et al. | |
| 4,677,393 A | 6/1987 | Sharma | |
| 4,717,884 A | 1/1988 | Mitzlaff | |
| 5,083,094 A | 1/1992 | Forsberg | |
| 5,136,256 A | 8/1992 | Salzberg | |
| 5,389,890 A | 2/1995 | Burrage | |
| 5,430,411 A | 7/1995 | Boulic | |
| 5,543,751 A | * 8/1996 | Stedman et al. | ........ 330/124 R |
| 5,663,682 A | 9/1997 | Meline et al. | |
| 5,896,065 A | 4/1999 | Myer | |
| 5,999,046 A | 12/1999 | Kotzamanis | |
| 6,094,097 A | 7/2000 | Ke | |
| 6,146,359 A | * 11/2000 | Carr et al. | ................... 604/114 |
| 6,194,980 B1 | * 2/2001 | Thon | .......................... 333/109 |
| 6,262,629 B1 | 7/2001 | Stengel et al. | |
| 6,384,680 B1 | 5/2002 | Takei et al. | |
| 6,396,349 B2 | 5/2002 | Takei et al. | |
| 6,639,463 B1 | * 10/2003 | Ghanadan et al. | ...... 330/124 R |
| 2001/0019289 A1 | 9/2001 | Takei et al. | |

FOREIGN PATENT DOCUMENTS

| | | |
|---|---|---|
| FR | 2525834 | 4/1982 |
| JP | 2002043857 | * 2/2002 |
| WO | WO03/065599 | 8/2003 |

OTHER PUBLICATIONS

IBM Technical Disclosure Bulletin "Transistor Audio Amplifier" Apr. 1960.*
International Search Report in PCT/US2004/O09265, Mailed Sep. 9, 2004.

* cited by examiner

Primary Examiner—Michael B Shingleton
(74) Attorney, Agent, or Firm—Wood, Herron & Evans, LLP

(57) ABSTRACT

An amplifier includes a main amplifier circuit and at least one auxiliary amplifier circuit. Portions of an RF signal to be amplified are delivered to the main and auxiliary amplifiers. The auxiliary amplifier circuit is selectively operable to operate in combination with the main amplifier circuit, such as based on the level of the RF signal. At least one hybrid coupler circuit has input ports coupled with outputs of the main amplifier circuit and auxiliary amplifier circuit. The hybrid coupler circuit is operable to combine amplifier circuit output signals at a coupler first output port. A coupler second output port is terminated with one of an electrical short and an electrical open circuit.

39 Claims, 7 Drawing Sheets

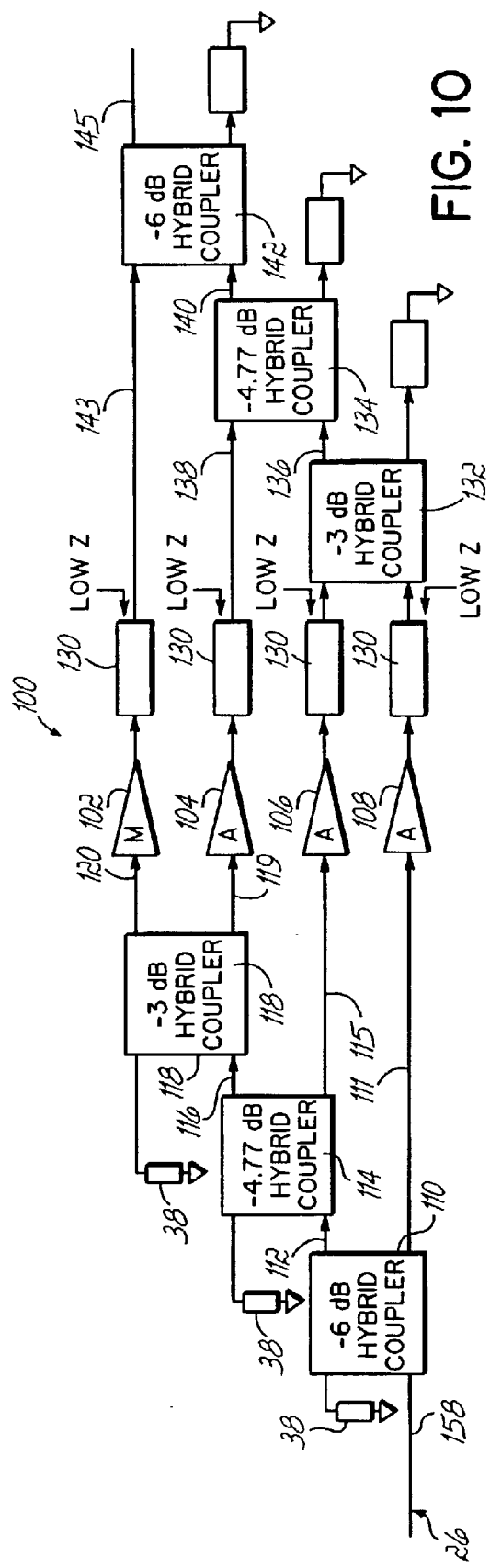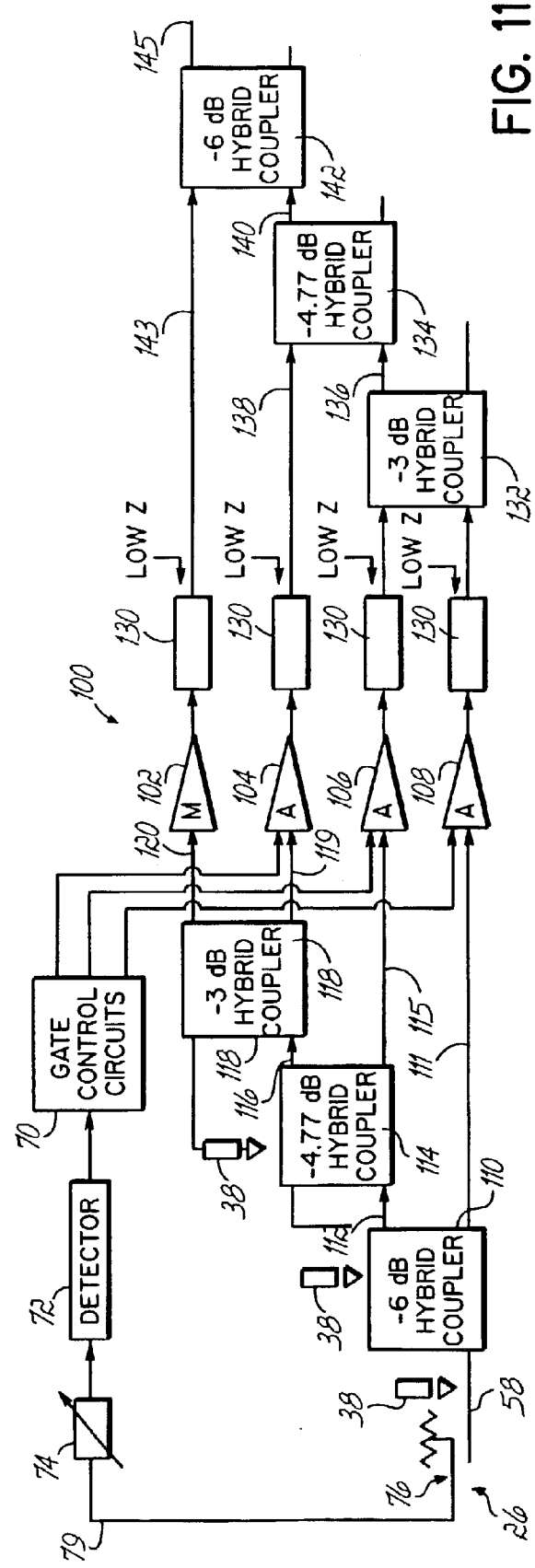

HIGH EFFICIENCY AMPLIFIER

FIELD OF THE INVENTION

The present invention relates generally to RF amplifiers, such as those used for wireless communications, and more specifically to RF amplifiers for handling significant peak-to-average ratio power applications.

BACKGROUND

RF amplifiers are utilized for a variety of applications in wireless communication systems, such as to amplify or transmit a downlink signal at a base station. As a result, the amplifiers must be able to handle the power requirements associated with such wireless communication systems. Particularly, amplifiers used for applications having high peak-to-average signal ratios must be able to handle or deliver significant peak power levels above their normal or average load. For example, in order to amplify a signal with a 10 dB peak-to-average ratio, while creating a minimal amount of non-linear distortion, an amplifier must be capable of delivering around 200 watts of power to generate an output signal with an average power of 20 watts.

The transistors used for the amplification in RF amplifiers actually run most efficiently when they are outputting close to their maximum power capability, or are operating in a saturated mode.

Typically, the closer to saturation an amplifier is operated, the greater the amount of nonlinear distortion it outputs. Therefore, it has become standard practice to decrease or "back off" the amplifier power output until the nonlinear distortion is at an acceptable level. As a result, for handling high peak-to-average signal ratio applications in an amplifier, several amplification devices are usually operated together and have their outputs combined. In such an amplifier, the devices or sub-amplifiers are operated inefficiently most of the time at low power in order to be able to deliver, somewhat more efficiently, the maximum power for the relatively short period of time when the high peaks in the signal are to be amplified.

Techniques have been developed to improve linearity in order to more efficiently deliver the desired power requirements for certain wireless communication applications. Several linear circuit architectures familiar to those skilled in the art of amplifier design have been developed (e.g., feed-forward, cross-cancellation, pre-distortion, etc.). Furthermore, to improve the efficiency of such architectures, amplification design has employed numerous transistor technologies (e.g., LDMOS, GaN, SiC, and Bipolar, etc.), as well as various amplifier architectures (e.g., Doherty, LINC, Envelope Elimination and Restoration, Bias Adaptation, etc.).

The Doherty amplifier architecture improves amplifier efficiency by effectively reducing the amplifier's saturated power level when the signal level is low, yet quickly ramping up to full power capability when the signal peaks demand it. Classically, the Doherty design uses quarter-wavelength transmission lines as impedance transforming and inverting elements, which are somewhat large, and generally are not readily reduced for surface mounting on printed circuit boards. Additionally, in some instances these quarter-wavelength transmission lines may limit the bandwidth over which the amplifier can efficiently operate. Furthermore, it is often difficult to implement the classic Doherty design for low frequencies because of the physical size of quarter-wavelength transmission lines.

Accordingly, it is still desirable to improve the amplification schemes for RF applications associated with high peak-to-average signals ratio. It is also further desirable to address the drawbacks in the prior art by providing efficient and linear amplification, during both low power and high power peak requirements. These, and other objectives, are addressed by the invention described and claimed herein.

BRIEF DESCRIPTION OF FIGURES

The accompanying drawings, which are incorporated in and constitute a part of this specification, illustrate embodiments of the invention and, together with a general description of the invention given above, and the detailed description of the embodiments given below, serve to explain the principles of the invention.

FIG. 10 is a block diagram of another alternative embodiment of an amplifier circuit in accordance with the principles of the present invention utilizing multiple auxiliary amplifiers.

FIG. 11 is a block diagram of another alternative embodiment of an amplifier circuit in accordance with the principles of the present invention utilizing multiple auxiliary amplifiers.

DETAILED DESCRIPTION

Figure 1:
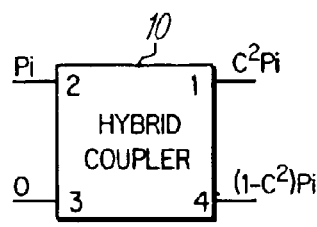
FIG. 1 is a block diagram of a hybrid coupler circuit.

The objectives noted above, as well as other objectives, are addressed by the present invention, which provides a high efficiency amplifier architecture for efficiently handling high peak-to-average signal ratio applications. The amplifier does so, without complicated and expensive electronics and RF switches. Furthermore, the amplifier is viable with linearization schemes, including digital, analog, and hybrid pre-distortion, Feed Forward, and Cross Cancellation. Furthermore, it is compatible with drain bias modulation schemes.

The present invention provides a new high efficiency power amplifier utilizing a load modulating scheme, like that of a classic Doherty amplifier, to improve amplifier efficiency when amplifying a signal with a high peak-to-average ratio. While utilizing some of the topology of a Doherty circuit in one embodiment of the invention, a new output topology is utilized to achieve the aspects of the present invention. To that end, some explanation of a classic Doherty circuit operation, which would be known to a person of ordinary skill in the art, is useful for understanding the operation of the present invention.

Generally, a simple Doherty circuit will combine the outputs of a main amplifier, such as a carrier amplifier and an auxiliary amplifier, such as a peaking amplifier. An input signal to the amplifiers is split, and the split signals are directed to the carrier amplifier and the peaking amplifier. The output of the carrier amplifier is combined through a quarter-wavelength impedance inverter with the output of the peaking amplifier, and the combined outputs are directed through a quarter-wavelength transformer to a load $Z_L$. The output of the peaking amplifier electrically acts like a current source and has a high output impedance. The output of the carrier amplifier acts like a current source and has a high output impedance until its output reaches saturation. After it reaches saturation, the output of the carrier or main amplifier looks like a voltage source and has low impedance.

Under a low input signal level drive condition, the peaking amplifier is turned OFF and its high output impedance is assumed to not significantly load the output circuit. The carrier amplifier's load impedance is then approximately 2 $Z_L$, which is approximately 2x the nominal design level and, thus, the amplifier operates at a similar nominal efficiency. When the input signal drive level is increased to where the carrier amplifier reaches saturation, the peaking amplifier is allowed to turn ON, thus contributing current to the output circuit. The additional current causes the effective impedance inverter's output to increase which, in turn, results in a decreasing load impedance at the carrier amplifier's output. As the input drive continues to rise, the carrier amplifier is kept in a voltage-saturated condition, but the power level of that saturated condition increases due to the decreasing load impedance. At the same time, the peaking amplifier is contributing power to the output of the amplifier. At the highest input drive level, both the carrier and peaking amplifiers have their designated nominal load impedance, $Z_L$, at their respective outputs, and are delivering their maximum rated power to the load.

The present invention, while utilizing the combination of a main and an auxiliary amplifier, does not utilize separate quarter-wavelength transmission lines at the output to form an impedance inverter and an impedance transformer to combine the amplifier output signals. Rather, the present invention utilizes a hybrid coupler in the output transforming/combining circuitry. This is a distinctive difference from the prior art. The output coupler provides significant advantages and is significantly simpler to implement than the classic Doherty design with quarter-wavelength lines. For example, hybrid couplers are commercially available and can be surface-mounted on a printed circuit board. Since the surface-mounted hybrid couplers are typically implemented with higher dielectric constant materials, they can be physically smaller than quarter-wavelength transmission lines used in the classic Doherty design. Use of a hybrid coupler provides for a wider bandwidth response for the amplifier than available with the classic Doherty circuit. Furthermore, use of the hybrid couplers allows the invention to be extended to low frequencies, which were difficult to implement with large quarter-wavelength transmission lines. Accordingly, the present invention provides significant benefits over the classic Doherty design.

The present invention utilizes a hybrid coupler as the combining circuitry for the outputs of the main and auxiliary amplifiers. Therefore, a brief explanation of the operation of a hybrid coupler is helpful in understanding the invention.

Referring to FIG. 1, a hybrid coupler 10 is illustrated as having port numbers 1–4. As discussed, ports 2 and 3 might be considered input ports and ports 1 and 4 as output ports. Generally, if ports 1, 3 and 4 are terminated in the coupler's characteristic impedance, such as, but not restricted to, 50 Ohms, and an input signal is applied to port 2, a portion of the input signal's power $P_i$ appears at port 1, and the remaining portion of the input signal's power appears at port 4. Ideally, little or no power would appear at the output of port 3. Generally, as understood by a person of ordinary skill in the art, the output signal portions at port 4 will have a phase that is shifted −90 degrees relative to the output signal portion at port 1. A similar operation occurs when port 2 is terminated and an input signal is applied to port 3. Ideally, no power would appear at port 2. The signal portion at port 1 will have a phase that is shifted −90 degrees relative to the output signal portion at port 4. An example of a very common hybrid coupler is a −3 dB hybrid coupler, which generally splits an input signal, such as at port 2, equally between the output ports 1 and In the present invention, the hybrid coupler utilized may be implemented in many different ways. For example, the hybrid coupler 10 in FIG. 1 may be implemented utilizing transmission lines, coupled transmission lines, lumped element inductors and capacitors, and transformers. In one embodiment of the invention, a coupled transmission line design is utilized for a coupler design in the >500 MHz region. However, the new system does not preclude the use of other implementations. For example, an implementation of the hybrid coupler for an HF, or VHF, high efficiency amplifier may utilize a transformer.

Figure 2A:
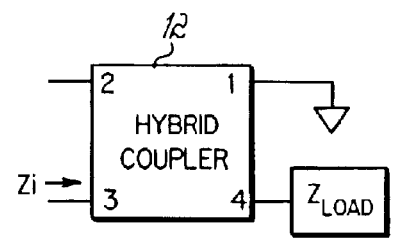
FIG. 2A is a block diagram of combining circuitry for an amplifier in accordance with one aspect of the present invention.
Figure 2B:
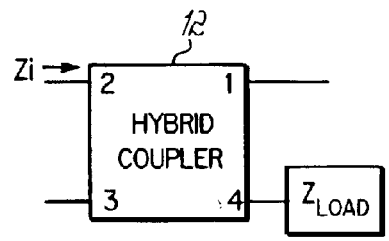
FIG. 2B is a block diagram of combiner circuitry in accordance with another aspect of the present invention.

FIGS. 2A and 2B illustrate two different hybrid coupler termination schemes applicable to combining output signals for the current high efficiency power amplifier invention.

In FIG. 2A, for hybrid coupler 12, port 1 of the hybrid coupler is terminated in a short circuit and port 4 is terminated in a load impedance $Z_{load}$, which could match the characteristic impedance of the coupler, for example. Port 2 is left unterminated or as an open circuit. In such a case as illustrated in FIG. 2A, and where the coupler is a −3 dB design, the input impedance $Z_i$ is equal to 2 $Z_{load}$.

An alternative configuration is illustrated in FIG. 2B, wherein port 1 of the hybrid coupler 12 is terminated in an open circuit, rather than being shorted, and port 4 is terminated in the characteristic impedance of the coupler $Z_{load}$. Port 3 is left un-terminated or as an open circuit. In this case, the input impedance $Z_i$ is also equal to $2 Z_{load}$ for the case of a −3 dB hybrid coupler. The coupler arrangements of FIGS. 2A, 2B are utilized to combine the outputs of main and auxiliary amplifiers in accordance with the principles of the invention.

Figure 3A:
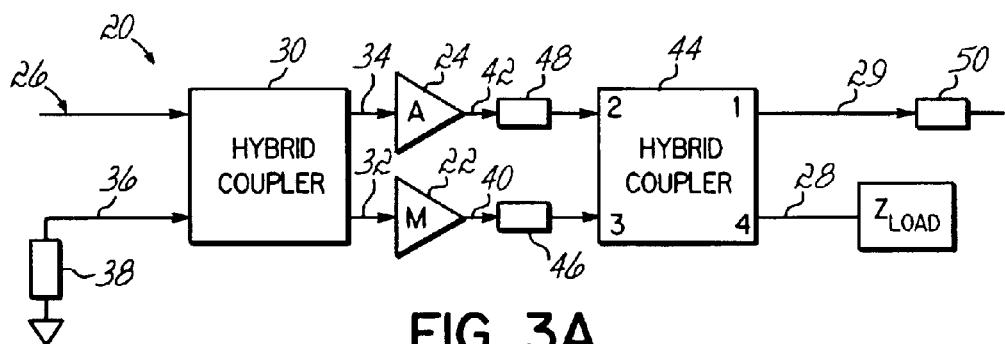
FIG. 3A is a block diagram of an embodiment of an amplifier circuit in accordance with the principles of the present invention.
Figure 3B:
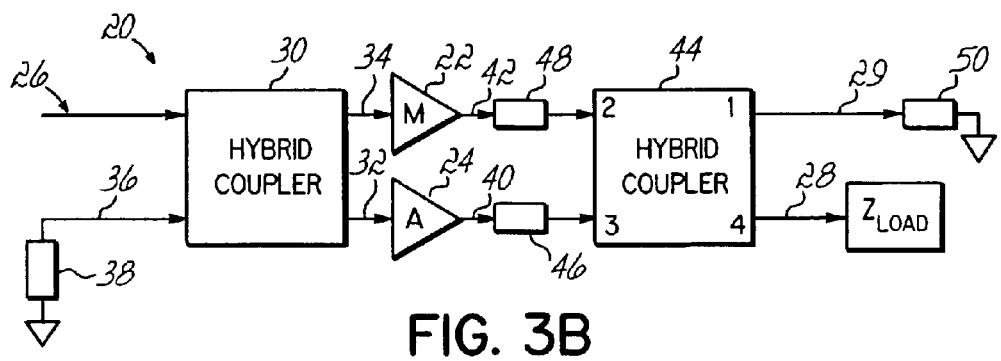
FIG. 3B is a block diagram of another embodiment of an amplifier circuit in accordance with the principles of the present invention.

FIGS. 3A and 3B illustrate embodiments of the invention utilizing a main amplifier circuit and an auxiliary amplifier circuit, with outputs coupled through a hybrid coupler in accordance with the principles of the present invention. FIG. 3A illustrates a block diagram of one embodiment of the invention wherein the amplifier 20 incorporates a main amplifier circuit or carrier amplifier 22 and an auxiliary amplifier circuit or peaking amplifier 24. In accordance with one aspect of the present invention, the auxiliary amplifier circuit 24 is selectively operable to operate at selected times in combination with the main amplifier circuit 22. That is, the auxiliary amplifier circuit 24 may be kept OFF until peak power requirements call for a higher power output from the amplifier 20, at which time it is turned ON and operated to increase the power output of the amplifier 20. Herein, the term "selectively operable" indicates the amplifier operational state changes in response to an external signal. That external signal may be, but is not limited to, the input signal to be amplified, an analog control signal, or a digital control signal. For example, the operational state of a Class-C amplifier changes in response to its input signal. Herein, the term "amplifier circuit" is utilized to indicate various amplifier components, which operate to amplify a signal and which may themselves be parts of a larger overall amplifier, such as amplifier 20. The term "amplifier circuit" is, therefore, not limited to a single amplifier or single stage of amplification. For example, each of the main amplifier circuit 22 and auxiliary amplifier circuit 24 might incorporate various stages of amplification, but will be referred to herein generally as amplifier circuits.

Generally, amplifier 20 includes a main amplifier input or primary amplifier input 26 and an amplifier output 28. That is, an RF signal input at 26 is amplified and presented at output 28 to a load or effective load impedance $Z_{load}$, although the amplifier output 28 may include combined amplified signals from the main amplifier circuit 22 and auxiliary amplifier circuit 24 in accordance with the invention.

The input signal 26 is divided between the main amplifier circuit 22 and auxiliary amplifier circuit 24. In accordance with one aspect of the present invention, an input hybrid coupler circuit 30 is utilized for splitting the input signal 26 into individual signals or signal components 32, 34. Signal 32 from the splitting coupler 30 is coupled as an input signal to main amplifier circuit 22, while signal 34 is coupled as an input signal to auxiliary amplifier circuit 24. The coupler circuit 30 therefore acts as a splitting coupler circuit to split or divide the input signal 26. The division ratio of the coupler determines the relative amplitude of signals 32 and 34. This division ratio may be used to partially determine the selectively operable characteristics of the auxiliary amplifier. In one embodiment of the invention, the hybrid coupler circuit 30 is a −3 dB hybrid coupler. The −3 dB coupler circuit 30 divides the input signal 26 into generally equal amplitude input signals 32, 34 for the amplifier circuits 22, 24. The other input 36 of the coupler circuit 30 is terminated through a suitable impedance such as a 50 Ohm resistor 38 to ground. The divided or split signals are then amplified respectively by the main amplifier circuit 22, or the main amplifier circuit in combination with the auxiliary amplifier 24. The amplifier circuits are also designated in the figures as "M" and "A" for "main" and "auxiliary". As noted, the auxiliary amplifier circuit is selectively operable to operate in combination with main amplifier circuit 22 when needed for peak power requirements or applications.

In accordance with an aspect of the present invention, a hybrid coupler circuit 44 is coupled with the outputs of the main amplifier circuit 22 and the auxiliary amplifier circuit 24. Specifically, amplified output signals 40, 42 are coupled to the input ports 3, 2, respectively, of coupler circuit 44. The hybrid coupler circuit 44, similar to hybrid coupler circuit 30, may be a −3 dB hybrid coupler, for example. In accordance with one aspect of the present invention, and discussed further herein below, phasing lines 46, 48 are coupled at the amplifier circuit outputs 40, 42 and in-line between the amplifier circuits 22 and 24, respectively, and the output hybrid coupler circuit 44. Generally, the phasing lines 46, 48 are short lengths of transmission line, which have a selectable length and are used to present a desired characteristic impedance to the input of the coupler circuit 44. The phasing lines 46, 48 are selected to operate in conjunction with any output matching circuitry of the amplifier circuits, as discussed below, to maximize or minimize the effective amplifier output impedance $Z_{out}$, depending on the hybrid coupler configuration to be used. In one embodiment, the auxiliary amplifier circuit 24 is selectively operable to be turned ON and OFF as needed to handle power requirements. In an alternative embodiment, the main amplifier 22 might also be selectively operable to turn it OFF.

The hybrid coupler circuit 44 is operable to combine the amplifier circuit outputs at output port 4 as a coupler first output 28, which is reflective of the output from amplifier 20. The present invention terminates the other output port 1 with one of an electrical short or electrical open circuit. This may be done directly at the port or spaced from the port by utilizing a tuned open-circuit transmission line 50, as illustrated in FIGS. 3A, 3B. The tuned open-circuit transmission line has a length selected to generally reflect the desired short circuit or open circuit to the respective output port 1 of the hybrid coupler 44. Specifically, the open-circuit transmission line 50 may be in the form of a length of transmission line, such as a length of co-axial cable, which is specifically tuned or dimensioned to provide an efficient output 28 for the amplifier 20.

FIG. 3A is reflective of a hybrid coupler configuration, as illustrated in FIG. 2A wherein output port 1 is terminated in a short using an open circuit transmission line 50 to reflect an electrical short to port 1 of the hybrid coupler circuit 44. Alternatively, an effective short circuit might be physically located directly adjacent to port 1 of the hybrid coupler, similar to the configuration as illustrated in FIG. 2A. However, the transmission line section 50, such as a quarter-wavelength (90 degree) transmission line will allow the termination, whether a short or open circuit, to be moved away from the coupler port. In accordance with the aspects of the present invention, the length of the open circuit transmission line 50 is selected to reflect one of an electrical short or an electrical open circuit at output port 1.

FIG. 3B illustrates an alternative embodiment of the invention, wherein an open circuit is used for the termination of port 1, such as wherein a length of transmission line 50 is selected with a short at one end to reflect an open circuit to the hybrid coupler circuit 44. In FIGS. 3A and 3B, like components are given similar reference numerals. In the FIG. 3B embodiment, the position of the main (M) amplifier circuit, or carrier amplifier 22 and the position of the auxiliary (A) amplifier circuit, or peaking amplifier 24, are reversed with respect to the embodiment as illustrated in FIG. 3A.

For both of the configurations illustrated in FIGS. 3A and 3B, the operation of the amplifier might be considered in a similar fashion as the operation of a classic Doherty system, upon which the invention improves. In the case of −3 dB couplers, when the input power at input 26 is low, the auxiliary (A) amplifier circuit or peaking amplifier 24 is turned OFF, and its output looks like an open circuit. At that power level, the carrier amplifier load is 2 $Z_{load}$. As the signal level is increased and the peaking amplifier 24 is turned ON, the load impedance for the carrier amplifier 22 will gradually decrease to the nominal design $Z_{load}$.

In accordance with one aspect of the present invention, the auxiliary amplifier circuit 24 is selectively turned ON and OFF as needed for peak power requirements. As such, there may be a significant amount of time in which only the main amplifier circuit 22 is operating. The present invention, with a short or open circuit presented to the port 1 of the coupler, provides significant advantages to simply terminating the port with the characteristic impedance of the coupler. In a hybrid coupler having one output port (e.g. port 1) terminated through a characteristic impedance, such as a 50 Ohm resistor to ground, a 6 db power loss would be realized when the auxiliary amplifier circuit is OFF. For example, should one of the amplifier circuits be OFF, such as the auxiliary amplifier circuit 24, half the power of the remaining amplifier will be lost through the 50 Ohm terminated output of the coupler circuit. This results in a 6 dB loss, including a 3 dB loss from the auxiliary amplifier circuit being turned OFF, and another 3 dB loss because approximately half of the remaining amplifier's power (main amplifier circuit) is lost through the 50 Ohm termination load. Even if the auxiliary amplifier is not completely OFF, if one of the amplifiers changes its output significantly (e.g., in amplitude or phase), then a proportional amount of the power is lost through the 50 Ohm termination load as a function of the difference between the outputs.

Generally, the length of the transmission line, 50, or its impedance characteristics, are selected so that an electrical short or an electrical open circuit is reflected back into the coupler circuit 44. Once selected or tuned to provide the desired electrical short characteristics to the coupler circuit output port, the characteristics of the transmission line may essentially remain set as tuned. Therefore, if the length or width of the transmission line 50 is varied to change its electrical length or impedance characteristics, it may remain at the selected length or width regardless of whether the auxiliary amplifier circuit 24 is ON or OFF. Alternatively, the transmission line 50 might have a selectable effective length and effective impedance characteristic for possibly dynamically varying its effect on the circuit of the invention, although such dynamic adjustments may not be necessary.

As such, this new amplifier architecture allows additional amplifiers, such as additional auxiliary (A) amplifier circuits, to be added when increased power is required such as to handle peak power applications. When not needed, the auxiliary amplifier circuits can be shut OFF or their outputs reduced without a significant combining loss of signal amplitude. The main amplifier circuit may be operated efficiently with as little distortion as possible, and the auxiliary amplifier circuit may be selectively utilized as efficiently as possible. Therefore, the efficiency of the amplifier is significantly improved, while it is still able to handle peak power requirements.

As noted above, for typical Doherty amplifier operation, below saturation, both the main amplifier and auxiliary amplifier output impedances need to be high, such that they act as current sources. However, in most peaking and carrier amplifiers, the final stage device, usually a transistor, is followed by a matching network that transforms a convenient impedance level at the amplifier output (usually, but not restricted to, 50 Ohms) to a less convenient impedance level (perhaps, on the order of 2 Ohms), at the transistor terminals.

Figure 4:
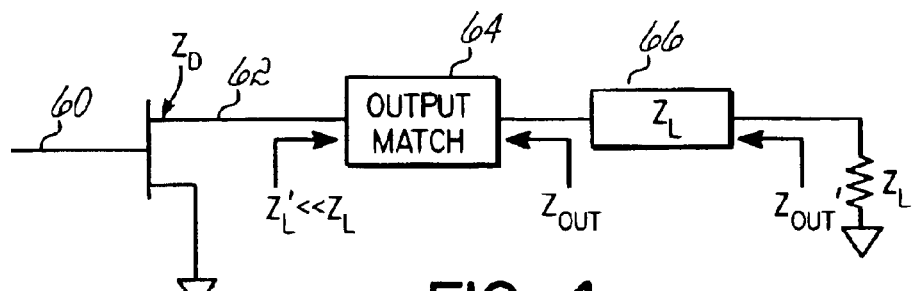
FIG. 4 is a block diagram illustrating output impedance characteristics of an amplifier.

Referring to FIG. 4, an illustrative output circuit is shown, showing an output matching network in combination with a phasing line for achieving a desirable impedance for the output of the amplifier circuits as they couple to the combining hybrid coupler 44 according to the invention. Specifically, the output terminal 62 of an amplifier transistor 60 is coupled with a matching network 64 to achieve a low impedance level $Z_L'$ 40. The value of $Z_L'$ is chosen to obtain optimal performance from the transistor device 60. Generally, depending upon the exact topology utilized for the matching network 64, an impedance inversion may occur. A matching network that causes an impedance inversion will cause the output impedance $Z_{out}$ to be low when the transistor output impedance $Z_D$ is high. In addition, when the output matching network 64 causes an impedance inversion, it is necessary to load the amplifier circuit with an impedance that is lower than the nominal design level (i.e. <$Z_L$) to have the amplifier operate in a more efficient mode. It should also be noted that, in this mode of the operation, the gain of the amplifier increases with decreasing load impedance. Such a condition is reflective of an inverted mode of a Doherty amplifier operation. In the present invention, and again referring to FIG. 4, the output impedance $Z_{out}$ will not be at the maximum possible value when a high $Z_{out}$ is desired. Similarly, the output impedance will not be at a minimum when a low $Z_{out}$ is desired. Therefore, in accordance with another aspect of the present invention, a short length of transmission line 66 is selected, having a characteristic impedance $Z_L$. The length of transmission line 66 is coupled between the output matching circuit and the load $Z_L$, as shown in FIG. 4. In accordance with the principles of the present invention, the phasing line 66, is selected to maximize or minimize $Z_{out}'$, depending upon the configuration of the amplifier to be utilized in the position of the main amplifier circuit and the auxiliary amplifier circuit.

Figure 5A:
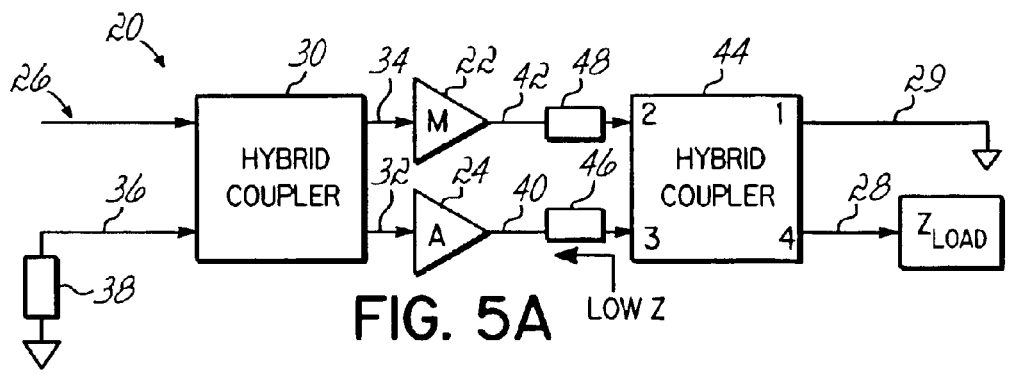
FIG. 5A is a block diagram of an alternative embodiment of an amplifier circuit in accordance with the principles of the present invention.
Figure 5B:
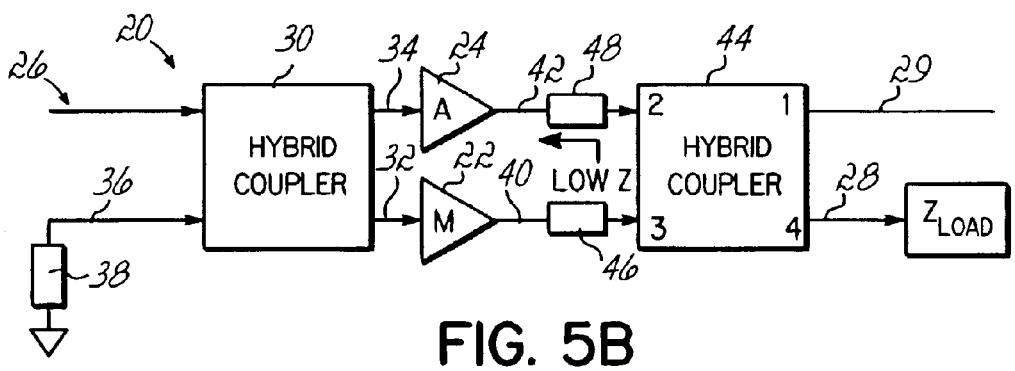
FIG. 5B is a block diagram of another alternative embodiment of an amplifier circuit in accordance with the principles of the present invention.

FIGS. 5A and 5B illustrate basic configurations of the high efficiency amplifier of the invention when operating in the inverted mode, i.e. when the transistor output has high impedance and the output matching network causes an impedance inversion, such that the output impedance is low. Referring to FIGS. 5A and 5B, they are similar to the configurations as utilized in FIGS. 3A and 3B, but the physical location of the main (M) amplifier circuit (carrier amplifier) and auxiliary (A) amplifier circuit (peaking amplifier) are reversed from their positions illustrated in FIGS. 3A and 3B. In this mode of operation, when the peaking amplifier is turned OFF, the carrier amplifier load is $C^2 Z_L$, which is lower than the nominal design value of $Z_L$. In the case where a −3 dB coupler is used, the carrier amplifier would see an impedance of approximately $Z_L/2$. As the input signal is increased, the peaking amplifier is turned ON, the load impedance on the carrier amplifier will gradually increase to the nominal design value of $Z_L$. For this configuration, the lengths of phasing lines 46, 48 and their effect, are chosen to achieve the desired low $Z_{out}'$ being presented to the input of coupler 44. This is in contrast to the case shown in FIGS. 3A and 3B, where the lengths of phasing lines 46, 48, and their effect, are chosen to achieve the desired high $Z_{out}'$ being presented to the input of coupler 44.

Generally, the choice of the mode of operation, such as the noninverted mode, illustrated in FIGS. 3A and 3B, or the inverted mode, as illustrated in FIGS. 5A and 5B, is best determined after the peaking and carrier amplifier matching circuit designs are complete. When the resultant amplifier impedances are high, those topologies illustrated in FIGS. 3A and 3B are preferable. When the resultant amplifier impedances are low, those topologies illustrated in FIGS. 5A and 5B are preferable.

In one embodiment of the present invention, main amplifier circuits and auxiliary amplifier circuits with generally equal power output capabilities, or power ratings, are utilized. As such, the hybrid couplers 44 utilizing the output may be −3 dB hybrid couplers, which are suitable for amplifiers with equal output power ratings. Alternatively, when amplifying signals with sufficiently high peak-to-average ratios, it may be advantageous to use an auxiliary or peaking amplifier with a higher output rating than the main or carrier amplifier. For example, the auxiliary amplifier might be rated at twice the output power of the carrier amplifier. In such a case, and in accordance with the various embodiments of the invention described herein, the design of the coupler may be selected to address any differences between the output power ratings of the various amplifier components. For example, for an auxiliary amplifier rated at twice the output power of the main amplifier, a −4.77 dB design may be utilized. Generally, the choice of input coupler value for the combining hybrid coupler 44 depends upon the relative gains of the main and auxiliary amplifiers. Generally, the various configurations shown in the Figures herein can be designed to operate with any ratio of auxiliary amplifier to main amplifier power ratings.

In the present invention, as with the classic Doherty amplifier, as the relative size of the peaking amplifier is increased, the output power at which the amplifier reaches its first efficiency peak, will decrease. The plot in FIG. 6 indicates this effect. The vertical axis is amplifier efficiency (1=100%), while the horizontal axis is the output signal voltage level relative to the maximum rating. The α=0.5 curve represents the ideal result, when the auxiliary amplifier and the main amplifier have the same output power rating. The α=0.25 curve represents the ideal result, when the auxiliary amplifier's output power rating is three times (3×) that of the main amplifier.

Figure 6:
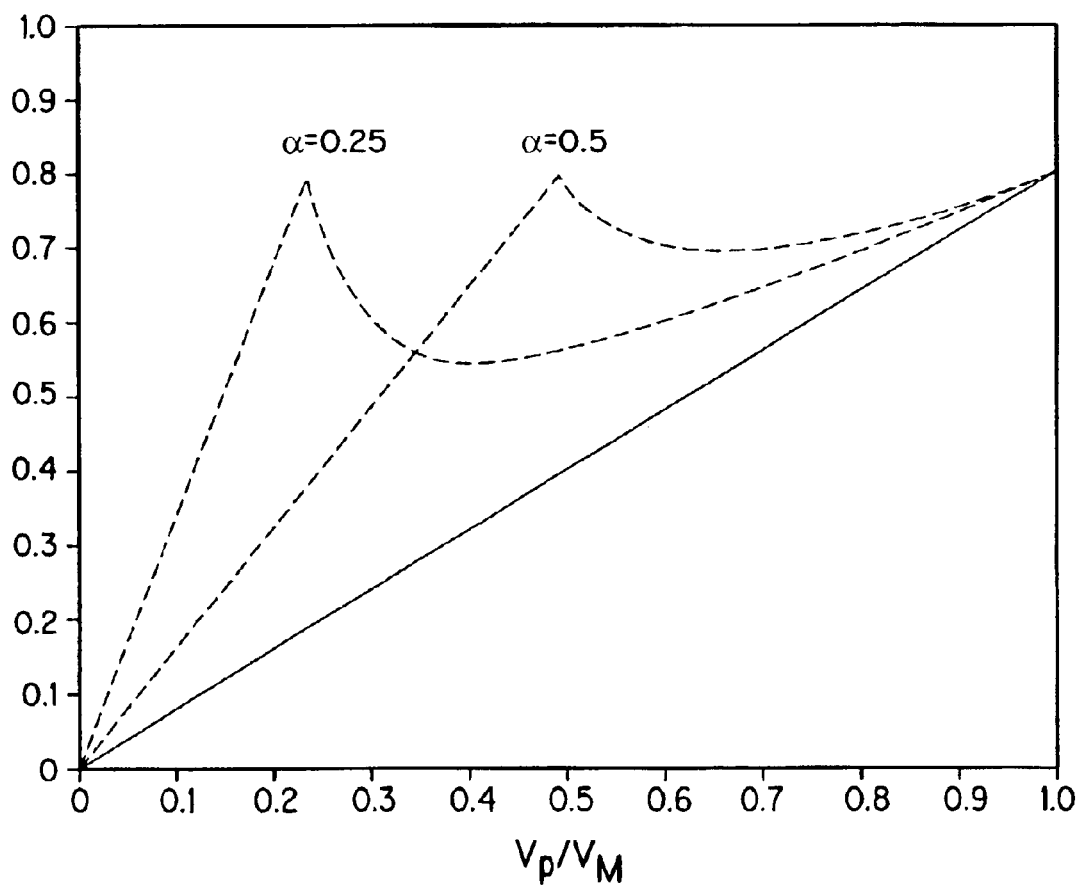
FIG. 6 is a plot of amplifier efficiency for the embodiments of the present invention.
Figure 7:
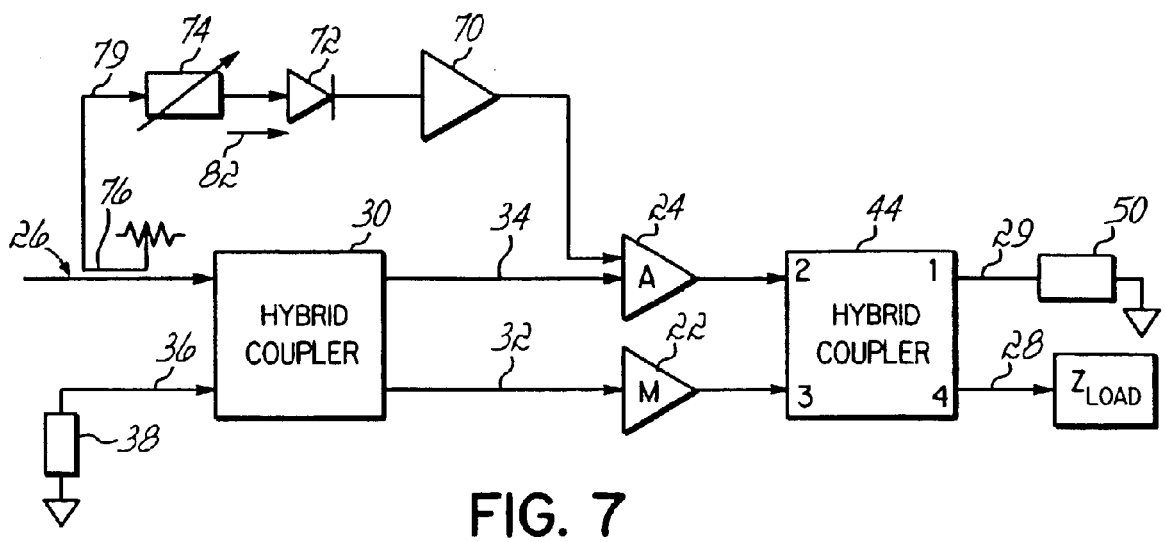
FIG. 7 is a block diagram of an alternative embodiment of an amplifier circuit in accordance with the principles of the present invention.

In accordance with another aspect of the present invention, it may not be possible to achieve the desired efficiency curves, such as those in FIG. 6, using standard RF transistors because of their turn ON characteristics. Rather, as illustrated in FIG. 7, a gate control circuit 70 may be utilized to control turn ON characteristics of auxiliary amplifier circuit 24. As noted above, the main amplifier circuit 22 might also be selectively operated to be turned ON and OFF and, therefore, may also use the gate control circuit 70. However, for the purpose of illustration, the gate control circuit 70 will be described with respect to its use with auxiliary amplifier circuit 24. Similar reference numerals are utilized for similar components as described above.

A detector 72 detects the instantaneous power at the input 26 and an attenuator 74 might be utilized to adjust or condition the input signal delivered to the detector. The output of the detector is an input to the gate control circuit 70. A portion of the input signal 26 is coupled off by a coupler 76 with a portion of the signal provided to hybrid coupler circuit 30 and another portion 79 of the signal provided to the gate control circuit 70.

Based upon the level of the signal 79 detected by the detector 72 in the gate control path 82, the gate control circuit 70 is operated to control the turn ON characteristics of the auxiliary amplifier circuit 24. Specifically, the gate (or base or grid) biases are modulated to thereby control the TURN ON characteristics. Various different techniques for such gate bias modulation and gate control are known to those skilled in the art and such appropriate techniques may be utilized. This allows the auxiliary amplifier 24 to remain turned OFF until a higher input signal level is reached, while still allowing the auxiliary amplifier to reach its full output capability at the peak input signal level. As discussed further herein below, the use of gate control may be used with any of the disclosed embodiments.

Figure 8:
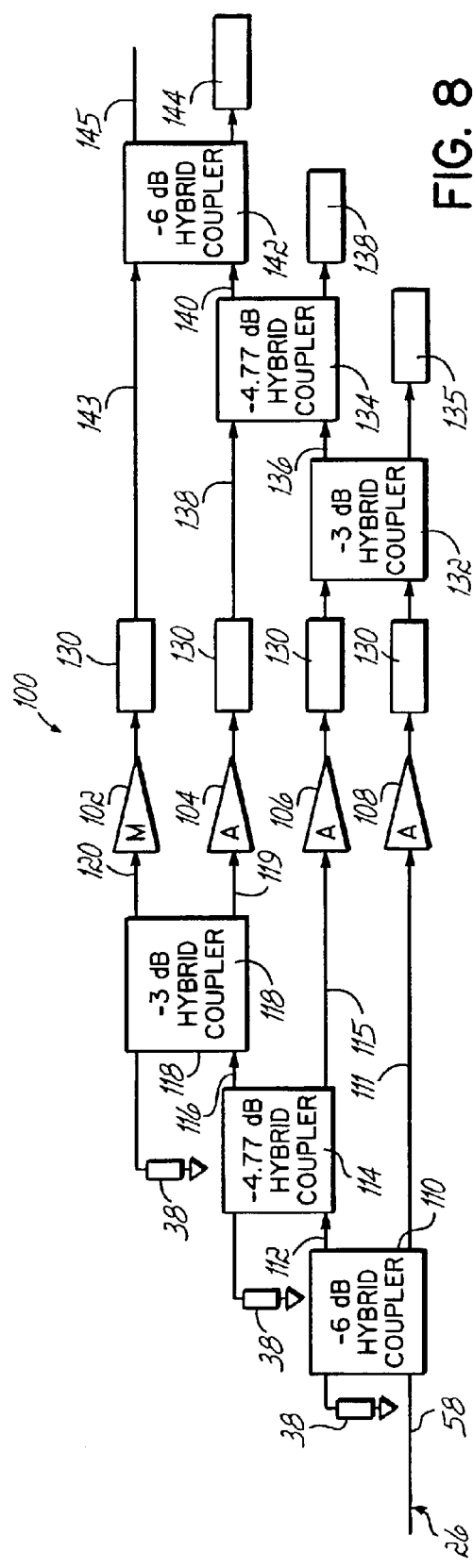
FIG. 8 is a block diagram of an alternative embodiment of an amplifier circuit in accordance with the principles of the present invention utilizing multiple auxiliary amplifiers.
Figure 9:
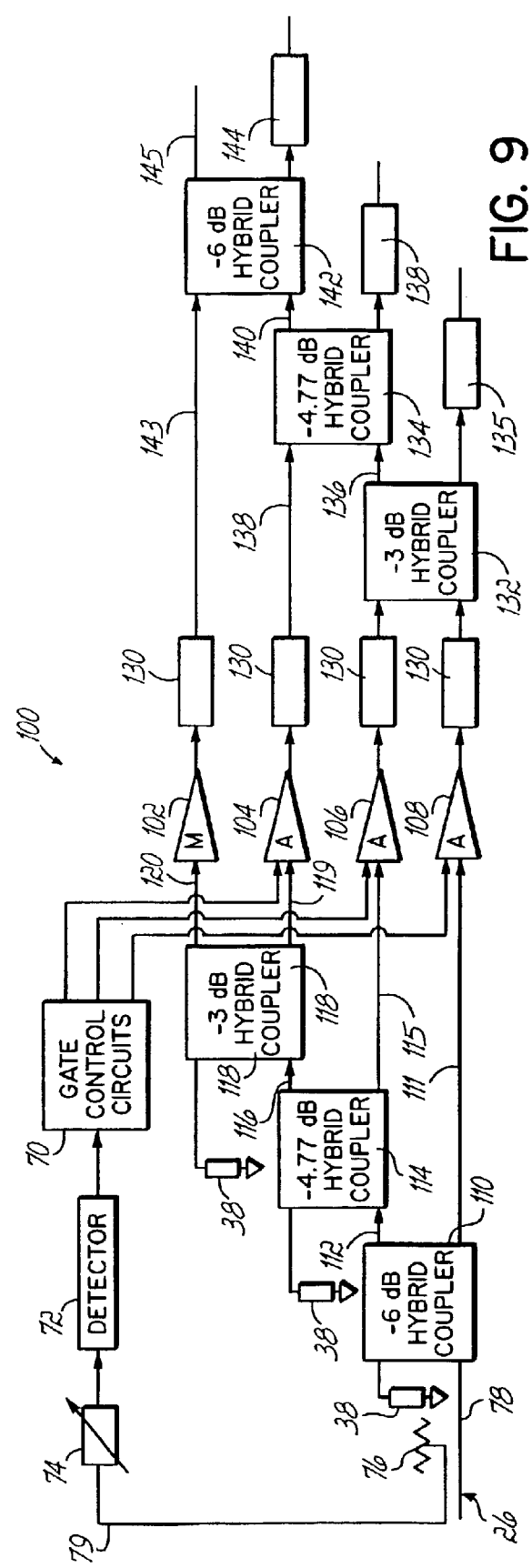
FIG. 9 is a block diagram of another alternative embodiment of an amplifier circuit in accordance with the principles of the present invention utilizing multiple auxiliary amplifiers.

FIGS. 8 and 9 illustrate alternative embodiments of the invention utilizing a plurality of auxiliary (A) amplifier circuits in addition to a main (M) amplifier circuit. That is, the invention may be extended to cases with more than two amplifiers. The plurality of auxiliary amplifier circuits are selectably operable to be operated in various combinations with the main amplifier circuit. Therefore, the amplifier of the invention may handle peak power applications at more numerous incremental power increases to achieve greater efficiency.

FIG. 8 illustrates one embodiment of the invention utilizing multiple amplifiers, arranged in a serial combiner arrangement. To that end, the hybrid coupler circuits will have different coupling characteristics as appropriate for controlling the level of input signal to the various amplifiers in such a serial feed and output combination. Similar reference or numerals are utilized for the similar components as discussed above with other embodiments. For amplifier 100, the main amplifier circuit 102 is utilized in combination with three auxiliary amplifier circuits 104, 106, 108. As noted above, although the embodiments illustrated herein show various numbers of auxiliary amplifiers, such illustrated embodiments are not limiting and a greater or lesser number of amplifier circuits, both main and auxiliary, might be utilized. As noted, common reference numerals are utilized for common components as discussed in the embodiments above.

An input signal 26 is input to the hybrid coupler circuits, and is directed on a path to coupler circuits 110, 114, 118, which further split the signal. Signal 26 is directed to a first hybrid coupler, such as a −6 dB hybrid coupler circuit 110. One output signal 111 from an output port of hybrid coupler circuit 110 is directed to auxiliary amplifier 108, while another output 112 is directed to a second hybrid coupler circuit 114, which may be a −4.77 dB coupler. The coupling value of the various couplers may vary based upon the serial feed arrangement in order to input generally equal signals to the various main and auxiliary amplifier circuits 102–108. The arrangement shown in FIGS. 8 and 9 assumes generally equal power output capabilities for the main and auxiliary amplifiers. Alternatively, different sized amplifiers might be used and the coupler values adjusted accordingly to adapt to unequal power ratings for the amplifiers.

The output 115 from the hybrid coupler circuit 114 is directed to auxiliary amplifier circuit 106, while another output 116 is directed to coupler circuit 118. Coupler circuit 118 may be a −3 dB coupler with its respective outputs 119, 120 being directed to the auxiliary amplifier 104 and the main amplifier 102, respectively. A serial arrangement to divide the input signal among the various amplifier circuits 102–108 is reflective of the serial combiner arrangement utilized at the output, as discussed further below.

The output signals of the main and auxiliary amplifier circuits 102–108 are coupled through phasing lines 130 to coupler circuits 132, 134, 142 arranged in a serial combiner arrangement. The outputs of auxiliary amplifiers 106, 108 are directed to coupler circuit 132, such as a −3 dB coupler. One output signal 136 of the coupler circuit 132 is directed to another hybrid coupler circuit 134, while the other output port is coupled to a tuned transmission line 135, which is tuned to reflect an electrical short to the coupler circuit, as discussed above. The other output 136 is combined with an output 138 from auxiliary amplifier circuit 104. Coupler circuit 134, which may be a −4.77 dB coupler circuit, has one output port coupled to a tuned transmission line 138, while the other output 140 is fed to a hybrid coupler circuit 142, where it is combined with the output 143 from the main amplifier circuit 102. Coupler circuit 142 may be a −6 dB coupler as illustrated. Similarly, a tuned, open-circuited transmission line 144 is coupled with an output port of the coupler circuit 142 to reflect a short to that port. The other output 145 is reflective of the combined output from the various amplifiers and coupler circuits, and provides the output of amplifier 100. In operation, for example, main amplifier circuit 102 might be on while, in sequence, the auxiliary amplifier circuits 104, 106, 108 are turned ON according to the level of the input signal. The phasing lines in FIGS. 8 and 9 are selected so that the maximum output impedance is presented to the inputs of couplers 132, 134, and 142.

The embodiment of the invention illustrated in FIG. 8 might also be utilized with gate control as illustrated in FIG. 9, wherein like reference numerals are utilized to illustrate the gate control circuitry as in FIG. 7. Specifically, in FIG. 9, the coupler circuit 76 couples off a portion of the signal 79, which is directed to appropriate gate controlled circuit 70 through an attenuator 74 and a detector 72. Outputs of the gate controlled circuit are coupled appropriately to the turn ON characteristic of the auxiliary amplifier circuits.

Further alternative embodiments of the invention are illustrated in FIGS. 10 and 11, which show multiple amplifiers having low impedance characteristics, such as "inverted mode" characteristics and with and without gate control, respectively.

Referring to FIG. 10, with like numerals utilized to designate similar components as illustrated in FIGS. 8 and 9, various main and auxiliary amplifiers 102–108, in combination with their respective phasing lines, will reflect a low output impedance at the input ports of the couplers. While the phasing lines 130 are given common reference numerals between each of the amplifiers, that does not indicate that such phasing lines will have generally the same length. Rather, the lengths of the phasing lines are shown to maximize or, as in the case of FIGS. 10 and 11, minimize the output impedance (see FIG. 4). The main amplifier and auxiliary amplifiers are arranged as set forth in FIGS. 8 and 9, with the auxiliary or peaking amplifiers being biased to turn ON at increasing input drive levels. Similarly, the turn-ON sequence will be amplifier 104, then 106, then 108, in that order. Since FIGS. 10 and 11 illustrate an inverted-mode operation of a multiple amplifier circuit, phasing transmission lines 130 are set so that a low impedance is presented to input ports of the various hybrid coupler circuits 132, 134, and 142. However, rather than terminating the isolated ports of the hybrid coupler circuits with electrical short circuits, as illustrated in FIGS. 8 and 9, open circuits are presented at the isolated ports of the output couplers. While FIG. 10 illustrates a length of transmission line terminated in a short, might be utilized to reflect an open circuit and move the termination away from the coupler, a single open circuit at the output ports might also be utilized.

FIG. 11 is similar to FIG. 10 and illustrates utilization of a gate controlled circuit for controlling the turn-ON bias for the auxiliary amplifiers.

As noted, with many of the embodiments illustrated herein, the power output capability of the amplifiers may be equal or unequal. Generally the hybrid coupler circuits and their coupling values may be chosen to reflect the relative amplifier power output capabilities. For various of the embodiments, particularly those utilizing two amplifiers, a −3 dB hybrid coupler may be suitable for main and auxiliary amplifiers with generally equal power output capabilities. Different coupler values, such as a −4.77 coupler, may be utilized for those situations in which the main and auxiliary amplifiers have unequal power capabilities.

Figure 12:
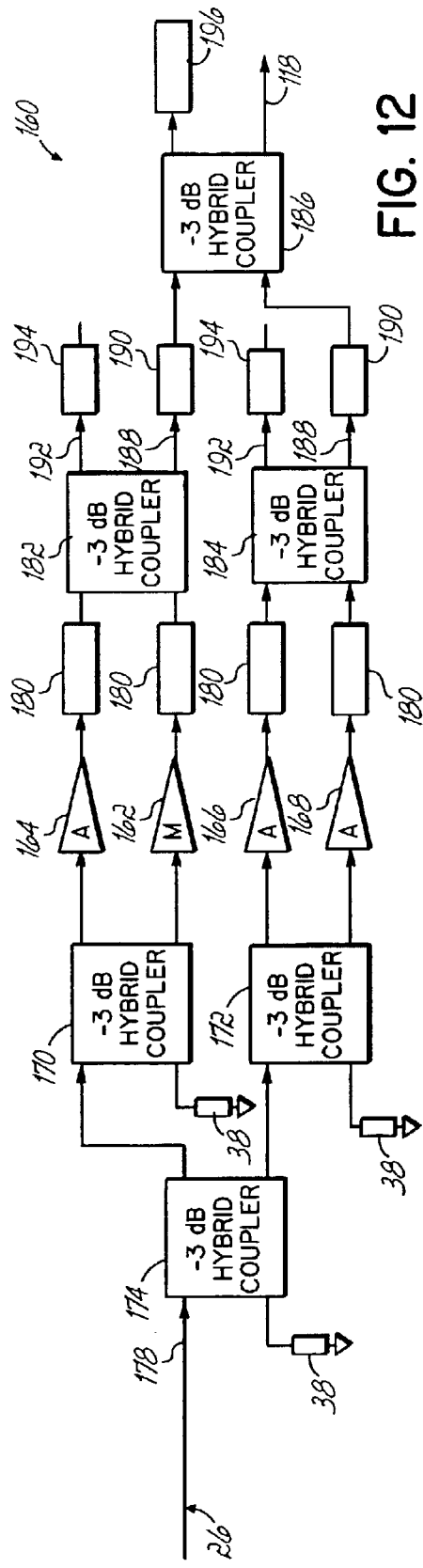
FIG. 12 is a block diagram of another alternative embodiment of an amplifier circuit in accordance with the principles of the present invention utilizing multiple auxiliary amplifiers.

The embodiments of FIGS. 8–11 are shown with a serial signal feed to the amplifiers. In an alternative multiple amplifier embodiment, a corporate or parallel feed arrangement might be used. Referring to FIG. 12, an amplifier 160 is illustrated, having a main amplifier circuit 162 and auxiliary amplifier circuits 164, 166, 168. The amplifier circuits are fed by a parallel or corporate signal divider arrangement, incorporating coupler circuits 170, 172, which may be −3 dB hybrid coupler circuits.

The plurality of amplifier circuits 162–168 are fed in a corporate arrangement and thus require multiple stages of hybrid coupler circuits. Therefore, a hybrid coupler circuit 174 is utilized to divide the incoming input signal generally equally between the coupler circuits 170, 172, which then feed the amplifier circuits. Like numerals are utilized in FIGS. 12 and 13 for similar signal and circuit components, as discussed herein above with respect to other Figures. The input coupler circuits, or splitting coupler circuits 170, 172, 174, have one input terminated through a 50 Ohm resistor 38 to ground.

In accordance with the principles of the present invention, the auxiliary amplifier circuits 164, 166, 168, along with the main amplifier circuit 162, are coupled to hybrid coupler circuits 182, 184, 186 to combine their various outputs to a single RF output 118. To that end, the outputs of main amplifier circuit 162 and auxiliary amplifier circuit 164 are coupled through appropriate phasing lines 180 to respective coupler circuit 182. Similarly, the auxiliary amplifiers 166, 168 are coupled through phasing lines 180 to a respective coupler circuit 184. The outputs from the coupler circuits 182, 184 are then combined through another coupler circuit 186 to form output signal 118. The coupler circuits 182, 184, 186 may be −3 dB hybrid couplers as illustrated or some other suitable coupler circuit. The coupler circuits are arranged in a corporate combiner arrangement.

In accordance with the principles of the invention, one of the outputs of each coupler circuit is the combined signal from the amplifier circuits or other components connected thereto. The other coupler output port is coupled to one of a short or open circuit, such as through a transmission line segment. Specifically, referring to FIG. 12, coupler circuit 182 has a first coupler output 188 which combines the amplifier output signals from amplifier circuits 162, 164 and passes them through to the coupler circuit 186.

For signal conditioning, and to present a high impedance to the coupler circuit 186, a phasing line 190 is utilized between coupler circuit 182 and coupler circuit 186. Similarly, phasing line 190 may be utilized for the coupler circuit 184 and the output 188 thereof, which is reflective of the amplifier circuits 166, 168. The other coupler output 192 of each of the coupler circuits 182, 184 feeds to an open-circuit tuned transmission line 194, which is selected so that an electrical short is reflected back into the coupler circuits 182, 184 respectively. As noted above, generally the length of the open-circuit transmission line 194 will be determined and set for a specific amplifier circuit and respective coupler circuit and will remain tuned. The coupler circuit 186 is terminated by an open-circuit tuned transmission line 196, which is tuned for reflecting an open circuit back to the output port of the coupler circuit 186. Therefore, in accordance with the principles of the present invention, the outputs of the amplifier circuits are combined efficiently so that the auxiliary amplifier circuits may be selectively operated to provide a peak power output for the amplifier 160.

Figure 13:
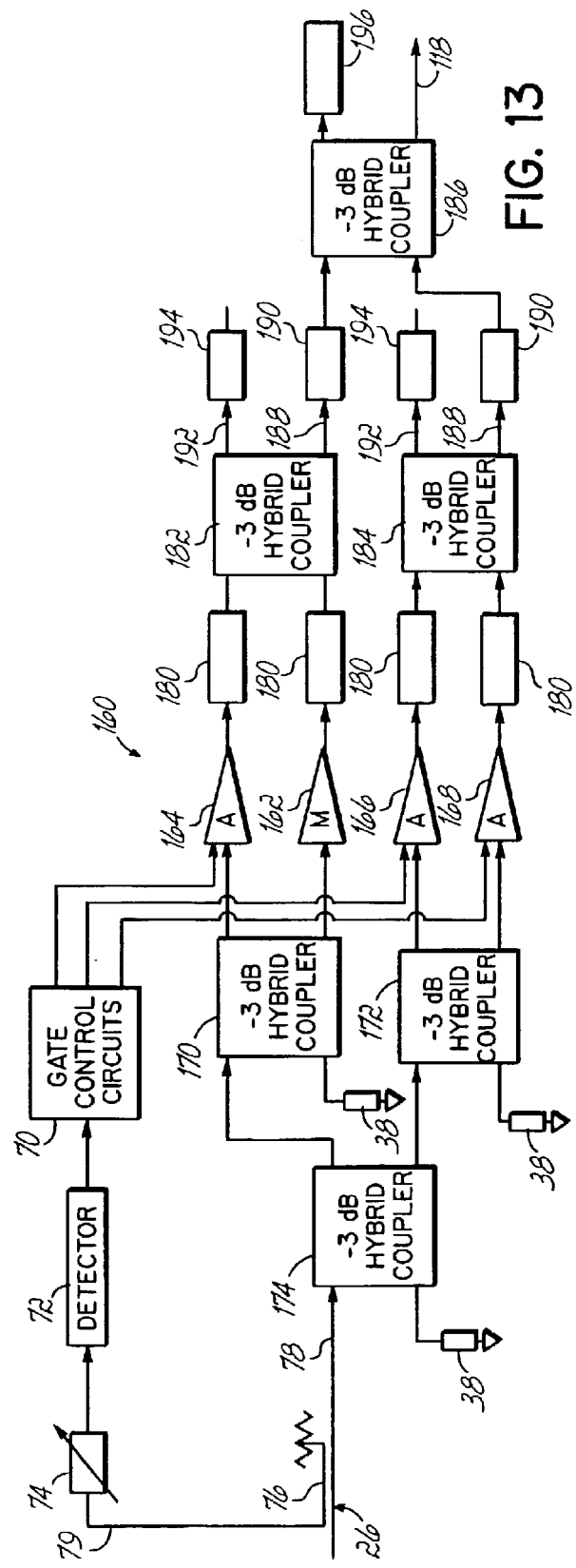
FIG. 13 is a block diagram of another alternative embodiment of an amplifier circuit in accordance with the principles of the present invention utilizing multiple auxiliary amplifiers.

In accordance with another embodiment of the present invention, as illustrated in FIG. 13, gate control circuit 70 may be operated to selectively turn ON the auxiliary amplifier circuits 164–168 as desired when signal peaks are detected by the detector 72. For example, main amplifier 162 may be ON and auxiliary amplifier 168 may be turned ON when a specific signal level is detected. As noted above, the gate control circuit 70 controls the turn ON characteristics of the auxiliary amplifier 168. As the detector 72 detects an increased input signal level, the gate control circuit 70 may be utilized to turn ON other auxiliary amplifier circuits, such as circuits 164 and 166. The coupler circuits 182, 184, and 186 combine the signals from the main and the auxiliary amplifier circuits into a single output 118 for the amplifier 160.

Figure 14:
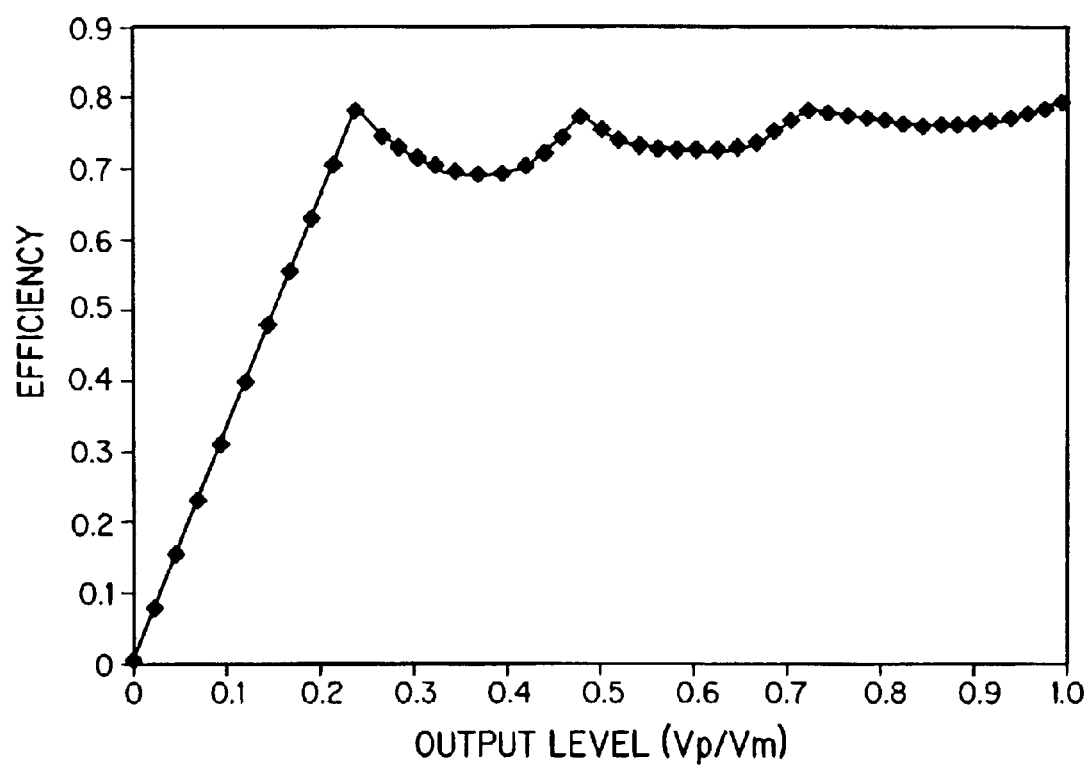
FIG. 14 is a graph of the efficiency of an embodiment of the present invention.

FIG. 14 depicts the efficiency characteristics that may be obtained with a system similar to that illustrated in FIG. 8, for example. The multiple amplifier system offers a better efficiency over a wider range of signal amplitudes than is generally obtained with a two-amplifier system (compare with FIG. 6).

The present invention is utilized to improve the efficiency performance for amplifier applications requiring high peak-to-average characteristics. The invention is viable with various linearization schemes, including digital, analog, and hybrid Pre-distortion, Feed Forward and Cross Cancellation. It is also compatible with drain biased modulation schemes.

While the present invention has been illustrated by a description of various embodiments and while these embodiments have been described in considerable detail, it is not the intention of the applicant to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the spirit or scope of applicant's general inventive concept.

What is claimed is:

1. An amplifier comprising:

a main amplifier circuit;

at least one auxiliary amplifier circuit, the auxiliary amplifier circuit being selectively operable to operate in combination with the main amplifier circuit;

at least one hybrid coupler having input ports coupled with, outputs of the main amplifier circuit and auxiliary amplifier circuit and operable to combine amplifier circuit output signals at a coupler first output port;

a coupler second output port terminated with a configuration that includes one of an electrical short circuit or an electrical open circuit, the configuration operable for reflecting one of an electrical short circuit condition or an electrical open circuit condition to the second output port.

2. The amplifier of claim 1 further comprising a tuned segment of a transmission line coupled to the coupler second output port, the transmission line segment being tuned to present one of an electrical short circuit condition or an electrical open circuit condition to the second output port.

3. The amplifier of claim 1 wherein the auxiliary amplifier circuit presents an effective high output impedance to an input port of the hybrid coupler.

4. The amplifier of claim 1 wherein the auxiliary amplifier circuit presents an effective low output impedance to an input port of the hybrid coupler.

5. The amplifier of claim 3 further comprising a phasing line which acts in conjunction with the auxiliary amplifier circuit to reflect a high output impedance to an input port of the hybrid coupler.

6. The amplifier of claim 4 further comprising a phasing line which acts in conjunction with the auxiliary amplifier circuit to reflect a low output impedance to an input port of the hybrid coupler.

7. The amplifier of claim 1 further comprising a gate control circuit coupled to the auxiliary amplifier circuit to selectively operate the auxiliary amplifier circuit.

8. The amplifier of claim 7 wherein said gate control circuit is operable to control turn ON characteristics of the operating auxiliary amplifier circuit.

9. The amplifier of claim 7 further comprising a detector operable to detect a level of an input signal to the amplifier, the gate control circuit being coupled to the detector and selectively operating the auxiliary amplifier circuit based upon an input signal level.

10. The amplifier of claim 9 further comprising an attenuator coupled to the detector for affecting the level of the input signal detected by the detector.

11. The amplifier of claim 1 wherein said main and auxiliary amplifier circuits have generally equal power output capabilities.

12. The amplifier of claim 11 wherein the hybrid coupler is a −3 dB coupler.

13. The amplifier of claim 1 wherein said main and auxiliary amplifier circuits have generally unequal power output capabilities.

14. The amplifier of claim 13 wherein the hybrid coupler has a coupling value reflective of the generally unequal power output capabilities of the amplifier circuits.

15. The amplifier of claim 1 further comprising a splitting coupler circuit coupled to inputs of the main and auxiliary amplifier circuits and operable for splitting an input signal to direct signals into the main and auxiliary amplifier circuits.

16. An amplifier comprising:

a main amplifier circuit;

a plurality of auxiliary amplifier circuits, the auxiliary amplifier circuits being selectively operable to operate in combination with the main amplifier circuit;

a first hybrid coupler having input ports coupled to receive output signals from the main amplifier circuit and from the auxiliary amplifier circuits and operable to the combine main and auxiliary amplifier circuit output signals at a coupler first output port;

a coupler second output port terminated with a configuration that includes one of an electrical short circuit or an electrical open circuit, the configuration operable for reflecting on of an electrical short circuit condition of an electrical open circuit condition to the second output port.

17. The amplifier of claim 16 further comprising:

a second hybrid coupler having input ports coupled to receive output signals from at least two auxiliary amplifier circuits, and operable to combine the auxiliary amplifier output signals at a first output port of the second hybrid coupler;

a second output port of the second hybrid coupler terminated with a configuration operable for reflecting one of an electrical short circuit condition or an electrical open circuit.

18. The amplifier of claim 17 wherein the first output port of the second hybrid coupler is coupled to an input port of the first hybrid coupler to provide the output signals from the auxiliary amplifier circuits.

19. The amplifier of claim 16 further comprising a tuned segment of a transmission line coupled to the coupler second output port, the transmission line segment being tuned to present one of an electrical short and an electrical open circuit to the second output port.

20. The amplifier of claim 16 wherein the auxiliary amplifier circuit presents an effective high output impedance to an input port of the hybrid coupler.

21. The amplifier of claim 16 wherein the auxiliary amplifier circuit presents an effective low output impedance to an input port of the hybrid coupler.

22. The amplifier of claim 20 further comprising a phasing line which acts in conjunction with the auxiliary amplifier circuit to reflect a high output impedance to an input port of the hybrid coupler.

23. The amplifier of claim 21 further comprising a phasing line which acts in conjunction with the auxiliary amplifier circuit to reflect a low output impedance to an input port of the hybrid coupler.

24. The amplifier of claim 16 further comprising a gate control circuit coupled to the auxiliary amplifier circuits to selectively operate the auxiliary amplifier circuits.

25. The amplifier of claim 24 wherein said gate control circuit is operable to control turn ON characteristics of the operating auxiliary amplifier circuit.

26. The amplifier of claim 24 further comprising a detector operable to detect a level of an input signal to the amplifier, the gate control circuit being coupled to the detector and selectively operating the auxiliary amplifier circuit based upon an input signal level.

27. The amplifier of claim 26 further comprising an attenuator coupled to the detector for affecting the level of the input signal detected by the detector.

28. The amplifier of claim 16 wherein said main and auxiliary amplifier circuits have generally equal power output capabilities.

29. The amplifier of claim 16 wherein said main and auxiliary amplifier circuits have generally unequal power output capabilities.

30. The amplifier of claim 16 further comprising at least one splitting coupler circuit coupled to inputs of the main and auxiliary amplifier circuits and operable for splitting an input signal to the splitting coupler circuit to direct signals into the main and auxiliary amplifier circuits.

31. The amplifier of claim 16 further comprising a plurality of hybrid couplers coupled to receive output signals from the main and auxiliary amplifier circuits in a corporate combiner arrangement for combining amplifier circuit output signals to form an output for the amplifier.

32. The amplifier of claim 16 further comprising a plurality of hybrid couplers coupled to receive output signals from the main and auxiliary amplifier circuits in a serial combiner arrangement for combining amplifier circuit output signals to form an output for the amplifier.

33. The amplifier of claim 30 wherein said splitting coupler circuit includes a plurality of coupler circuits arranged in one of a corporate and serial arrangement.

34. The amplifier of claim 31 wherein the couplers have generally the same coupler values.

35. The amplifier of claim 32 wherein the couplers have different coupler values.

36. An amplifier comprising:

a main amplifier circuit;

at least one auxiliary amplifier circuit, the auxiliary amplifier circuit being selectively operable to operate in combination with the main amplifier circuit;

at least one hybrid coupler having input ports coupled outputs of the main amplifier circuit and auxiliary amplifier circuit and operable to combine amplifier circuit output signals at a coupler first output port;

a coupler second output port terminated with a configuration that includes an electrical short circuit, the configuration operable for reflecting an electrical short circuit condition to the second output port.

37. An amplifier comprising:

a main amplifier circuit;

at least one auxiliary amplifier circuit, the auxiliary amplifier circuit being selectively operable to operate in combination with the main amplifier circuit;

at least one hybrid coupler having input ports coupled with outputs of the main amplifier circuit and auxiliary amplifier circuit and operable to combine amplifier circuit output signals at a coupler first output port;

a coupler second output port terminated with a configuration that includes an electrical short circuit and a tuned segment of a transmission line coupled to the electrical short circuit, the transmission line segment being tuned such that the configuration is operable for reflecting an electrical open circuit condition to the second output port.

38. An amplifier comprising:

a main amplifier circuit;

at least one auxiliary amplifier circuit, the auxiliary amplifier circuit being selectively operable to operate in combination with the main amplifier circuit;

at least one hybrid coupler having input ports coupled with outputs of the main amplifier circuit and auxiliary amplifier circuit and operable to combine amplifier circuit output signals at a coupler first output port;

a coupler second output port terminated with a configuration that includes an electrical open circuit, the configuration operable for reflecting an electrical open circuit condition to the second output port.

39. An amplifier comprising:

a main amplifier circuit;

at least one auxiliary amplifier circuit, the auxiliary amplifier circuit being selectively operable to operate in combination with the main amplifier circuit;

at least one hybrid coupler having input ports coupled with outputs of the main amplifier circuit and auxiliary amplifier circuit and operable to combine amplifier circuit output signals at a coupler first output port;

a coupler second output port terminated with a configuration that includes an electrical open circuit and a tuned segment of a transmission line coupled to the electrical open circuit, the transmission line segment being tuned such that the configuration is operable for reflecting an electrical short circuit condition to the second output port.

* * * * *

UNITED STATES PATENT AND TRADEMARK OFFICE
CERTIFICATE OF CORRECTION

PATENT NO. : 6,922,102 B2
APPLICATION NO. : 10/402800
DATED : July 26, 2005
INVENTOR(S) : Robert E. Myer et al.

It is certified that error appears in the above-identified patent and that said Letters Patent is hereby corrected as shown below:

Column 4, line 40, reads "the output ports 1 and"
and should read --the output ports 1 and 4.--

Column 8, line 14, reads "impedance level $Z_L 40$."
and should read --impedance level $Z_L 1$.--

Column 12, line 48, rewrite this paragraph as follows to show the correct indented format:

In accordance with the principles of the invention, one of the outputs of each coupler circuit is the combined signal from the amplifier circuits or other components connected thereto. The other coupler output port is coupled to one of a short or open circuit, such as through a transmission line segment. Specifically, referring to Figure 12, coupler circuit 182 has a first coupler output 188 which combines the amplifier output signals from amplifier circuits 162, 164 and passes them through to the coupler circuit 186. For signal conditioning, and to present a high impedance to the coupler circuit 186, a phasing line 190 is utilized between coupler circuit 182 and coupler circuit 186. Similarly, phasing line 190 may be utilized for the coupler circuit 184 and the output 188 thereof, which is reflective of the amplifier circuits 166, 168. The other coupler output 192 of each of the coupler circuits 182, 184 feeds to an open-circuit tune line 194, which is selected so that an electrical short is reflected back into the coupler circuits 182, 184 respectively.

Signed and Sealed this

Twenty-fifth Day of May, 2010

David J. Kappos
*Director of the United States Patent and Trademark Office*

Column 12, line 48 (CONTINUED FROM PAGE 1)
As noted above, generally the length of the open-circuit transmission line 194 will be determined and set for a specific amplifier circuit and respective coupler circuit and will remain tuned. The coupler circuit 186 is terminated by an open-circuit tuned transmission line 196, which is tuned for reflecting an open circuit back to the output port of the coupler circuit 186. Therefore, in accordance with the principles of the present invention, the outputs of the amplifier circuits are combined efficiently so that the auxiliary amplifier circuits may be selectively operated to provide a peak power output for the amplifier 160.

Column 13, line 40, reads "intention of the applicant to restrict or" and should read --intention of applicants to restrict or--

Column 13, line 48, reads "scope of applicant's general inventive concept." and should read --scope of applicants' general inventive concept--

Column 13, line 56, (Claim 1) reads "with, outputs of the main amplifier circuit" and should read --with outputs of the main amplifier circuit--

Column 14, line 54-56, (Claim 16) reads "and operable to the combine main and auxiliary amplifier circuit output signals at" and should read --and operable to combine the main and auxiliary amplifier circuit output signals at--

Column 14, line 60-62, (Claim 16) reads "reflecting on of an electrical short circuit condition of an electrical open circuit condition to the second output port" and should read --reflecting one of an electrical short circuit condition or an electrical open circuit condition to the second output port--

Column 16, line 10-11, (Claim 36) reads "at least one hybrid coupler having input ports coupled outputs of the main amplifier circuit" and should read --at least one hybrid coupler having input ports coupled with outputs of the main amplifier circuit--